United States Patent [19]
Lee et al.

[11] Patent Number: 6,104,326
[45] Date of Patent: Aug. 15, 2000

[54] BIT SYNCHRONIZATION APPARATUS FOR RECOVERING HIGH SPEED NRZ DATA

[75] Inventors: Bhum Cheol Lee; Eun Chang Choi; Kwon Chul Park, all of Daejeon, Rep. of Korea

[73] Assignees: Electronics and Telecommunications Research Institute, Daejeon; Korea Telecom, Seoul, both of Rep. of Korea

[21] Appl. No.: 09/136,734

[22] Filed: Aug. 19, 1998

[30] Foreign Application Priority Data

Oct. 14, 1997 [KR] Rep. of Korea ............... 1997-52621

[51] Int. Cl.$^7$ ........................... H03M 5/06; H03B 27/00
[52] U.S. Cl. ................................. 341/68; 331/57
[58] Field of Search .................... 341/68, 69; 331/34, 331/57, 46

[56] References Cited

U.S. PATENT DOCUMENTS

| | | | |
|---|---|---|---|
| 4,535,459 | 8/1985 | Hogge, Jr. ................................ | 375/80 |
| 5,334,952 | 8/1994 | Maddy et al. ........................ | 331/1 A |
| 5,432,480 | 7/1995 | Popescu ................................. | 331/11 |
| 5,619,170 | 4/1997 | Nakamura ............................ | 331/1 A |
| 5,696,468 | 12/1997 | Nise ....................................... | 331/14 |
| 5,748,048 | 5/1998 | Moyal .................................... | 331/14 |
| 5,854,575 | 12/1998 | Fieldler et al. ........................ | 331/10 |
| 5,950,115 | 9/1999 | Momtaz et al. ....................... | 455/73 |

OTHER PUBLICATIONS

Benny Lai et al., "A Monolithic 622Mb/s Clock Extraction Data Retiming Circuit", 1991 IEEE International Solid–State Circuits Conference, pp. 144–145.

K.E. Syed et al., "Gigahertz Voltage–Controlled Ring Oscillator", Electronics Letters, Jun. 5th 1986, vol. 22, No. 12, pp. 677–679.

*Primary Examiner*—Michael Tokar
*Assistant Examiner*—Peguy Jean Pierre
*Attorney, Agent, or Firm*—Jacobson, Price, Holman & Stern, PLLC

[57] ABSTRACT

An apparatus for recovering high speed NRZ (non-return to zero) data is disclosed. A phase-locked loop (PLL) frequency-divides the frequency which is outputted from a voltage-controlled ring oscillator, and therefore, the physical limit of the PLL is not affected. The voltage-controlled ring oscillators are installed separately from the PLL, and the voltage-controlled ring oscillators are synchronized with the PLL in the frequency only. Further, the oscillators are phase-locked to the incoming NRZ data, and two voltage-controlled ring oscillators are enabled/disabled by the binary values of the NRZ data. Therefore, a bit synchronization is realized, and thus, the voltage-controlled ring oscillators are directly controlled by the NRZ data. Consequently, the NRZ data can be recovered up to the frequency band at which the voltage-controlled ring oscillators and a D flip flop operate.

3 Claims, 5 Drawing Sheets

BIT SYNCHRONIZATION APPARATUS FOR RECOVERING HIGH SPEED NRZ DATA

BACKGROUND OF THE INVENTION

1. Field of the Invention

The present invention relates to a bit synchronization apparatus for recovering high speed NRZ (non-return to zero) data.

2. Description of the Prior Art

The data recovering apparatus had been mainly used in the transmission field at first, but recently, it came to be used for block-to-block connections and chip-to-chip connections.

In the conventional data recovering apparatus, the NRZ data are recovered by using a phase-locked loop (PLL) in which a phase detector is employed for directly comparing the transition phase of the inputting data with the transition phase of clock pulses outputted from a voltage control oscillator. (C. R. Hogge, "A SELF CORRECTING CLOCK RECOVERY CIRCUIT", J. Lightwave technology, vol. LT-3, No. 4, pp 1312–1314, Dec. 1985; and B. Lai and R. C. Walker, A MONOLITHIC 622 Mbps "CLOCK EXTRACTION DATA RETIMING CIRCUIT", ISSCC Digest Tech. Papers, pp 144–145, Feb 1991).

However, if the bit speed of the NRZ data becomes high, then the output pulse width of a charge-pump and a phase detector of the phase-locked loop (PLL) becomes too small, with the result that the PLL cannot carry out he bit synchronization function in a perfect manner.

In the conventional NRZ data recovering circuit, the output clock pulses of the voltage control oscillator are directly used in a phase comparator without carrying out a frequency division. Therefore, the speed of the recoverable NRZ data is decided by the operating speed of the charge-pump circuit and the phase detector of the PLL.

Generally, however, the charge-pump circuits and the phase detectors have relatively complicated constitutions. Consequently, they are limited in their operating speed, and therefore, the high speed NRZ data recovery becomes difficult.

SUMMARY OF THE INVENTION

The present invention is intended to overcome the above described disadvantages of the conventional techniques.

Therefore, it is an object of the present invention to provide a high speed NRZ data recovering apparatus in which the PLL technique is used, and a ring voltage-controlled oscillating technique is used for automatically adjusting the retiming clock pulse phase in accordance with the incoming NRZ data, so that the high speed NRZ data attaining to the maximum operating frequency of a flip flop and the ring voltage-controlled oscillator can be recovered.

In achieving the above object, the apparatus for recovering high speed NRZ data according to the present invention includes: a phase and frequency detecting means 10 for comparing the phase and the frequency of the frequency-divided signal of a voltage control oscillator with these of the incoming reference signal or the externally inputted NRZ data; a charge-pump means 11 connected to the phase and frequency detecting means 10, for converting the phase difference to electric currents; a loop filter means 12 connected to the charge-pump means 11, for integrating the electric currents to voltages; a first enabling/disabling voltage-controlled ring oscillator means 13 connected to the loop filter means 12, for controlling the frequency by varying the delays in accordance with the voltages; an N frequency-dividing means 14 connected to the first enabling/disabling ring voltage-controlled oscillator 13, for N-frequency-dividing the output frequency of the first enabling /disabling ring voltage-controlled oscillator to output the divided output to the phase and frequency detecting means 10; a second enabling/disabling ring voltage-controlled oscillator means 15 connected to the loop filter means 12, and having the same frequency as that of the first enabling/disabling ring voltage-controlled oscillator means 13, for being oscillated by being enabled at the falling edge transition of the externally inputted non-inverting NRZ data if the data is logic level 1 relative to the externally inputted non-inverting NRZ data; a third enabling/disabling ring voltage-controlled oscillator means 16 connected to the loop filter means 12, and having the same frequency as that of the first enabling/disabling ring voltage controlled oscillator means 13, for being oscillated by being enabled at the rising transition of the externally inputted non-inverting NRZ data if the data are high relative to the externally inputted non-inverting NRZ data; a synthesizing means 17 connected to the output terminals of the second enabling/disabling ring voltage-controlled oscillator means 15 and the third enabling/disabling ring voltage-controlled oscillator means 16, for synthesizing the outputs of the two oscillating means; and a retiming means 18 consisting of a flip flop, for receiving externally inputted non-inverting NRZ data into its data input terminal and for receiving the output of the synthesizing means 17 into its clock pulse input terminal to carry out the retiming of the data.

BRIEF DESCRIPTION OF THE DRAWINGS

The above object and other advantages of the present invention will become more apparent by describing in detail the preferred embodiment of the present invention with reference to the attached drawings in which.

DETAILED DESCRIPTION OF THE PREFERRED EMBODIMENT

Figure 1:
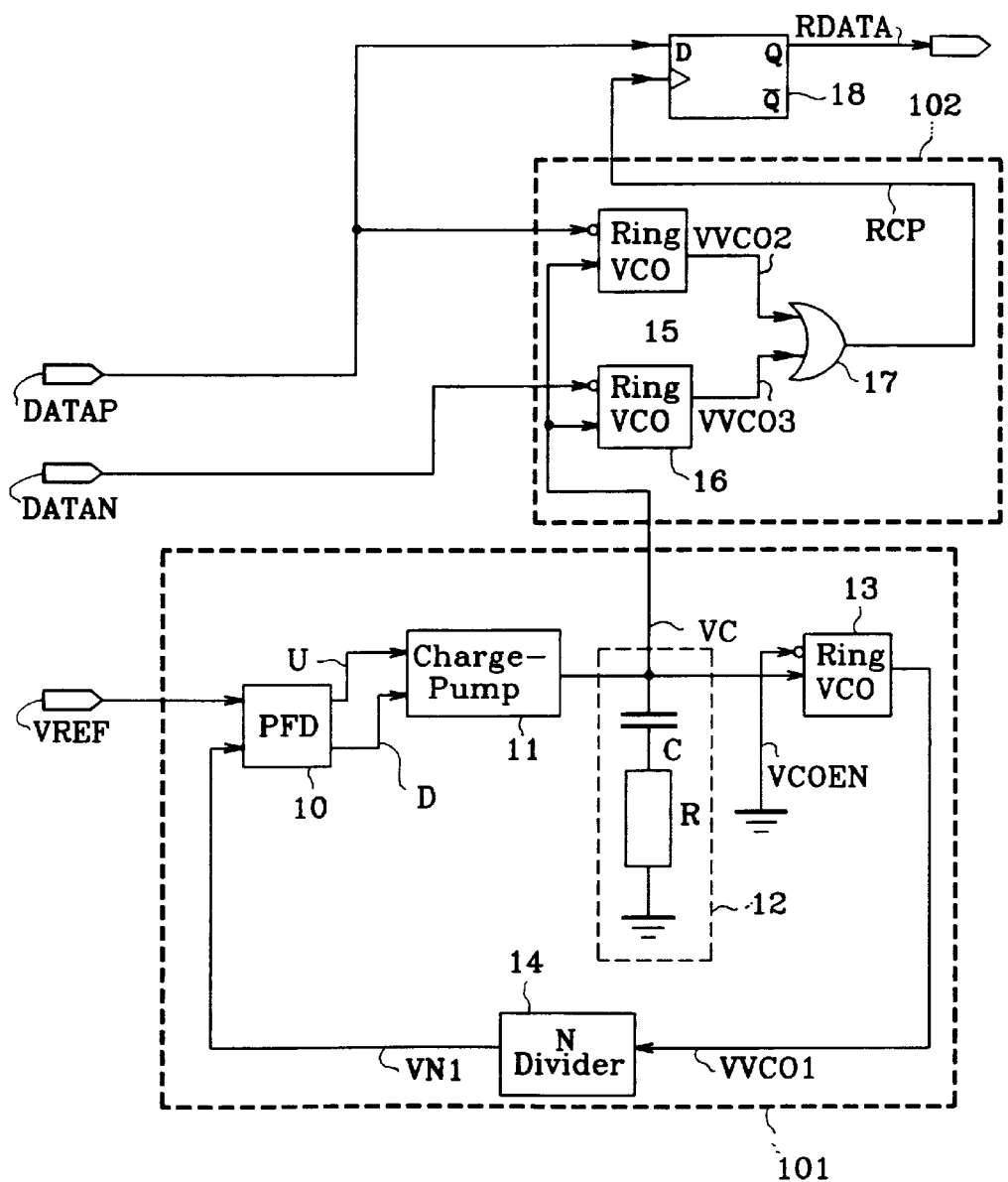
FIG. 1 is a block diagram showing the constitution of the high speed NRZ data recovering apparatus according to the present invention.

FIG. 1 is a block diagram showing the constitution of the high speed NRZ data recovering apparatus according to the present invention. Here, a PLL (phase locked loop) 101 is a known PLL. In FIG. 1, in order to make the operation of the PLL easily understood, the PLL is not constructed for a bit synchronization, but for a frequency synthesis or a frequency multiplication.

The apparatus of FIG. 1 includes: the PLL 101, second and third enabling/disabling voltage-controlled ring oscillators(VCO)15 and 16, a 2-input OR gate 17, and a D flip flop 18. The PLL 101 includes: a PFD (phase and frequency detector) 10, a charge-pump 11, and a loop filter 12, a first enabling/disabling voltage-controlled ring oscillator 13, and an N-frequency divider 14.

In FIG. 1, an ring VCO with phase aligner 102 includes: the second and third enabling/disabling ring voltage-controlled oscillators 15 and 16, and a 2-input OR gate.

An externally inputted reference signal VREF is that which is obtained by frequency-dividing the clock pulse extracted from the incoming NRZ data, or that which is obtained by frequency-dividing the source clock pulses by which the NRZ data is generated, or a local clock pulse having a high accuracy.

The reference signal VREF is inputted into the PFD 10 of the PLL 101, and the PFD 10 compares the phase and frequency of the N-frequency-divided signal VN1 which is obtained by frequency-dividing the output of the first enabling/disabling ring voltage-controlled oscillator 13 by the N frequency divider 14 with those of reference signal VREF.

The compared results are inputted into the charge-pump 11 which then outputs current pulses (as much as the phase difference) to the loop filter 12.

The loop filter 12 integrates the inputted current pulses to convert them into voltages so as to output them to the first to third enabling/disabling ring voltage-controlled oscillators 13, 15 and 16.

Therefore, if the first to third enabling/disabling ring voltage-controlled oscillators 13, 15 and 16 have been enabled, then their outputs are synchronized to the externally inputted reference signal VREF.

As a result, the frequency synchronizations of e first to third enabling/disabling ring voltage-controlled oscillators 13, 15 and 16 relative to the clock source (for driving the NRZ data) are improved, and this improved status is maintained.

The non-inverting NRZ data are inputted into enable/disable terminals of the second enabling/disabling ring voltage-controlled oscillator 15. Thus during the period when the non-inverting NRZ data are low, the second enabling/disabling ring voltage-controlled oscillator 15 is enabled. Further, at a time T/2 after the falling transition of the non-inverting NRZ data, the second enabling/disabling ring voltage-controlled oscillator 15 undergoes a rising transition, where T is an oscillating period of the first enabling/disabling ring voltage-controlled oscillator 13.

The inverting NRZ data are inputted into enable/disable terminals of the third enabling/disabling ring voltage-controlled oscillator 16. Thus during the period when the inverting NRZ data are low, the third enabling/disabling ring voltage-controlled oscillator 16 is enabled. Further, at a time T/2 after the falling transition of the inverting NRZ data, the third enabling/disabling ring voltage-controlled oscillator 16 undergoes a rising transition, and generates a pulse having a period T.

As a result, when the NRZ data are low, the second enabling/disabling ring voltage-controlled oscillator 15 generates a pulse having a period T after a time T/2 from the falling transition of the NRZ data. On the other hand, when the NRZ data are high, the third enabling/disabling ring voltage-controlled oscillator 16 undergoes a rising transition at a time T/2 from the rising transition of the NRZ data, and generates a pulse having a period T.

One input terminal of the 2-input OR gate 17 is connected to the output terminal of the second enabling/disabling ring voltage-controlled oscillator 15, while the other input terminal of it is connected to the output terminal of the third enabling/disabling ring voltage-controlled oscillator 16. Therefore, The 2-input OR gate 17 generates a retiming clock pulse having a period T and a rising transition positioning at the center of the eye pattern of the NRZ data.

The output of the 2-input OR gate 17 is inputted into a clock pulse input terminal CP of the D flip flop 18, and the non-inverting NRZ data are inputted into a data input terminal D of the D flip flop 18. Then the output terminal Q of the D flip flop 18 outputs the recovered NRZ data.

Under this condition, the 2-input OR gate 17 outputs a retiming clock pulse RCP or a recovered clock pulse.

Figure 2:
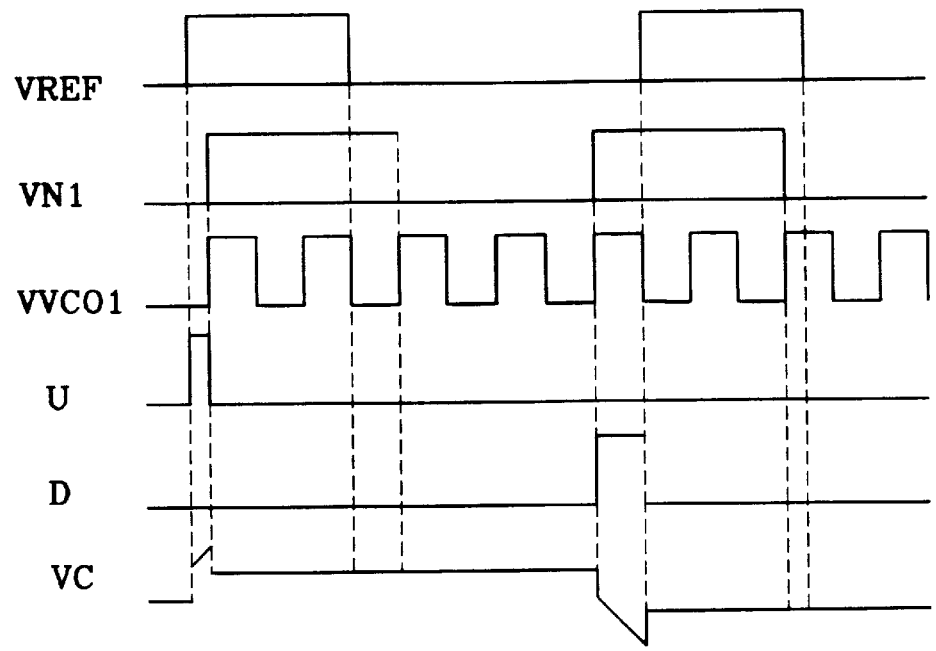
FIG. 2 is a timing chart for the respective sections of the high speed NRZ data recovering apparatus according to the present invention.
Figure 2:
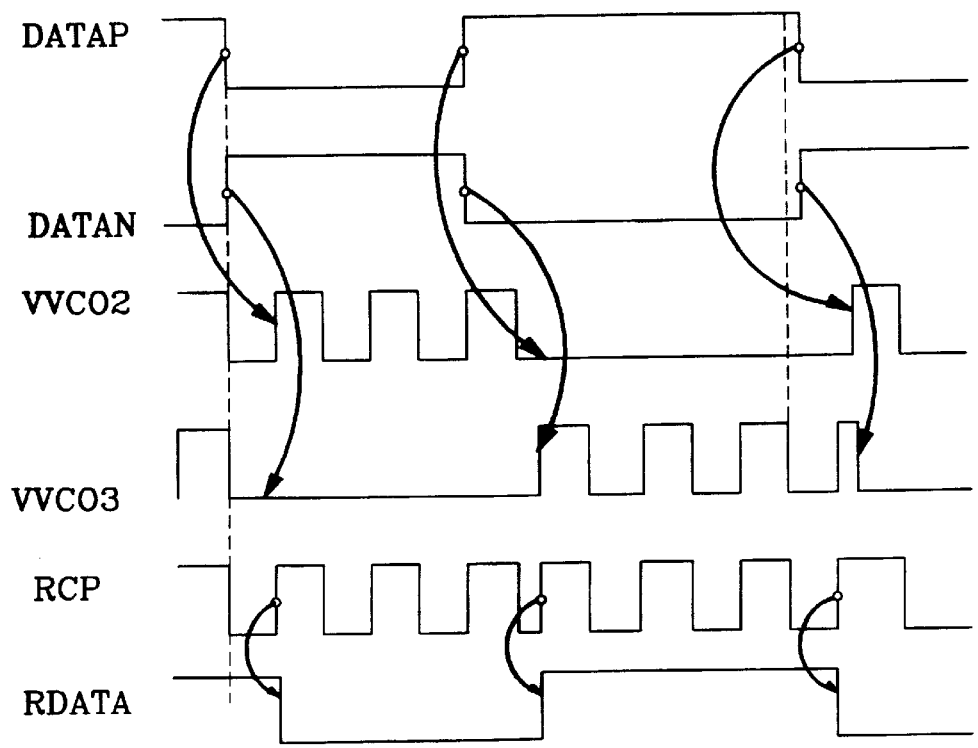

FIG. 2 is a timing chart for the each sections of the high speed NRZ data recovering apparatus according to the present invention. This drawing shows the timing for the respective sections of the apparatus of FIG. 1.

The timing of the respective sections of the PLL 101 are roughly classified into a case where the pulse transition of the reference frequency VREF leads a VN1 pulse transition and a case where the pulse transition of the reference frequency VREF lags behind the VN1 pulse transition, the VN1 being obtained by frequency-dividing the output of the first enabling/disabling ring voltage-controlled oscillator 13.

The wave patterns of VREF, VN1, VVCO1, D, U and VC of the PLL 101 are well known ones (F. M. Gardner, "CHARGE-PUMP PHASE-LOCKED LOOPS" IEEE Trans. Commun. vol com-28, pp 1849–1858, Nov. 1980).

The second enabling/disabling ring voltage-controlled oscillator 15 and the third enabling/disabling ring voltage-controlled oscillator 16 are controlled by the PLL 101. Therefore, when both of them are enabled, that is, when VCOEN is low, their outputs VVC02 and VVC03 are synchronized with the intrinsic period T, where T is the oscillating period of the first enabling/disabling ring voltage-controlled oscillator 13.

However, the period of the second and third enabling/disabling ring voltage-controlled oscillators 15 and 16 is T, and their outputs are repeatedly enabled and disabled. Therefore, the output of the 2-input OR gate 17 undergoes a rising transition after T/2 from the transition of the NRZ data. That is, a phase-adjusted recovery clock pulse RCP is outputted a rising transition positioning at the center of the eye patter of NRZ data.

In order to promote the understanding on the operating principles of the first to third enabling/disabling ring voltage-controlled oscillators 13, 15 and 16, their specific structure will be described in detail below.

Figure 3:
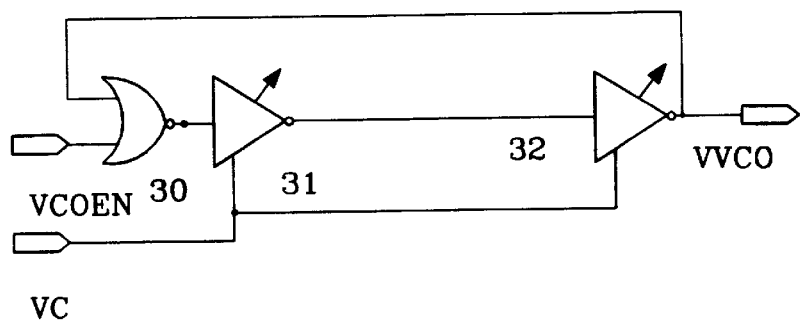
FIG. 3 is a circuit diagram showing a simplified constitution of the enabling/disabling voltage-controlled ring oscillator means of the high speed NRZ data recovering apparatus according to the present invention.

FIG. 3 is a circuit diagram showing a simplified constitution of the enabling/disabling ring voltage-controlled oscillator means of the high speed NRZ data recovering apparatus according to the present invention. That is, FIG. 3 is a simplified drawing of the circuit which can be applied to the first to third enabling/disabling ring voltage-controlled oscillators 13, 15 and 16.

The circuit of FIG. 3 includes: first and second delayable inverters 31 and 32, and a 2-input NOR gate 30. If the 2-input NOR gate 30 is replaced with the delayable inverter, then the circuit becomes the generally known ring voltage-controlled oscillator.

In FIG. 3, the oscillation is continued or intermittently repeated by the VCOEN which is one of the two input terminals of the 2-input NOR gate 30.

Figure 4:
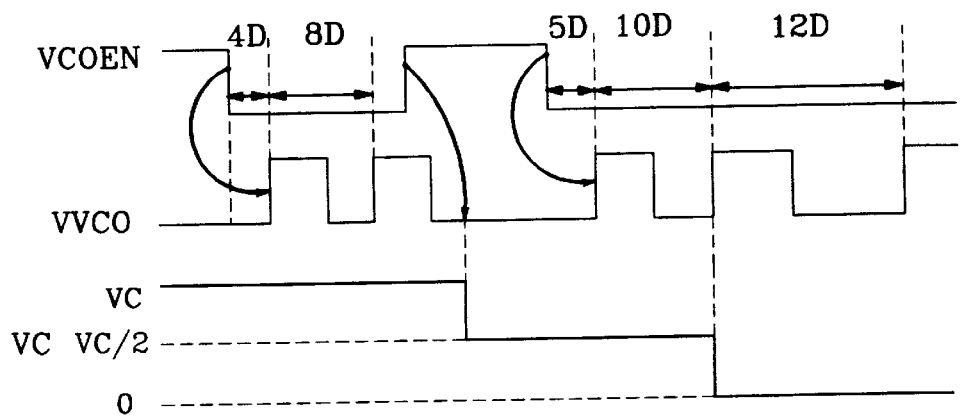
FIG. 4 is a timing chart for the each sections of the enabling/disabling ring voltage-controlled oscillator means of the high speed NRZ data recovering apparatus according to the present invention.

FIG. 4 is a timing chart for the each sections of the enabling/disabling ring voltage-controlled oscillator means of the high speed NRZ data recovering apparatus according to the present invention.

In order to analyze the timing as shown in FIG. 4, the propagation delay time of the 2-input OR gate is assumed to be D.

Further, in the case where the VC has the maximum value VC, the sum total of the propagation time delays of the first and second delayable inverters is assumed to be 3D. In the case where the VC is 0.5 VC, the sum total of the propagation time delays of the first and second delayable inverters is assumed to be 4D. In the case where the VC is 0, that is, where the VC has the minimum value, the sum total of the propagation time delays of the first and second delayable inverters is assumed to be 5D.

In the cases where VC=VC, VC=0.5 VC, VC=0, the timing charts are as shown in FIG. 4.

When the oscillation is enabled by VCOEN, attention should be given to the fact that a rising transition of VVCO occurs at a time T/2 from the falling transition time of VCOEN.

The oscillating period T is decided is, decided by VC. That is if VC=VC, then T=8D, while if VC=0, then T=12D.

Figure 5:
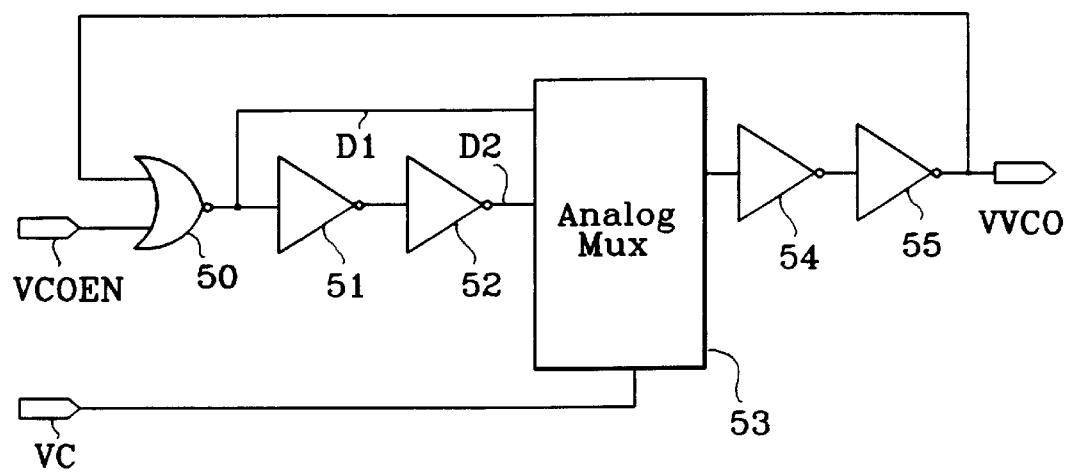
FIG. 5 is a circuit diagram showing the constitution of the enabling/disabling ring voltage-controlled oscillator means of the high speed NRZ data recovering apparatus according to the present invention.

FIG. 5 is a circuit diagram showing the constitution of the enabling/disabling ring voltage-controlled oscillator means of the high speed NRZ data recovering apparatus according to the present invention. This circuit can be applied to the first to third enabling/disabling ring voltage-controlled oscillators 13, 15 and 16.

The circuit of FIG. 5 includes: a 2-input is analogue multiplexer 53 capable of mixing two input voltage values; first to fourth inverters 51, 52, 54 and 55; and a 2-input NOR gate 50. If the 2-input NOR gate 50 is replaced with the inverter, then the circuit becomes the generally known ring voltage-controlled oscillator (K. E. Syed and A. A. Abidi, "GIGAHERTZ VOLTAGE-CONTROLLED RING OSCILLATOR", Electronic Letters, vol. 22, No. 12 pp 677–679 Jun. 5, 1986). The operating principle is same as that of the generalized prior art of R. C. Walker (R. C. Walker, "FULLY INTEGRATED HIGH SPEED VOLTAGE CONTROLLED RING OSCILLATOR", US4884041, Nov. 28, 1989).

In FIG. 5, if the propagation time delays of the 2-input NOR gate, the first to fourth inverters and an analog MUX are assumed to be D respectively, then the timing of the respective sections of FIG. 5 are as shown in FIG. 4.

In order to promote the understanding, the PLL 101 was described to carry out a frequency multiplication and a frequency synthesis for synchronizing to the externally inputted reference signal. However, there also can be used a bit synchronizing PLL which directly receives the data to carry out the bit synchronizing functions.

In this case, the input terminal of the PLL 101 will receive the NRZ data instead of the reference signal. Internally, the PLL 101 can frequency-divide the output of the first enabling/disabling ring voltage-controlled oscillator 13 and the NRZ data, without causing any problem.

In this case, when no external source clocks are supplied, the data recovery can be carried out in a simple manner, because a separate clock extracting circuit is not needed, that is, because the reference frequency is not required.

Therefore, in the present invention, the constitution of the PLL 101 does not matter, but it will be all right only if the first enabling/disabling ring voltage-controlled oscillator 13 is same as the second and third enabling/disabling ring voltage-controlled oscillators 15 and 16.

That is, the input terminals of the second and third enabling/disabling ring voltage-controlled oscillators 15 and 16 are connected to the output terminal of the internal loop filter 12 of the PLL 101, and therefore, they have the same period as that of the first enabling/disabling ring voltage-controlled oscillator 13.

Therefore, the apparatus of the present invention may include: second and third enabling/disabling ring voltage-controlled oscillator means 15–16 having the functions and constitutions same as those used in the PLL means 101, and connected to the PLL 101, for being synchronized to or disabled by the externally inputted NRZ data; a synthesizing means 17 connected to the second and third enabling/disabling ring voltage-controlled oscillator means 15–16, for synthesizing the pulses so as to synthesize the retiming clock pulses; and a retiming means 18 for receiving the output of the synthesizing means and the NRZ data to carry out a retiming on the NRZ data.

Figure 6:
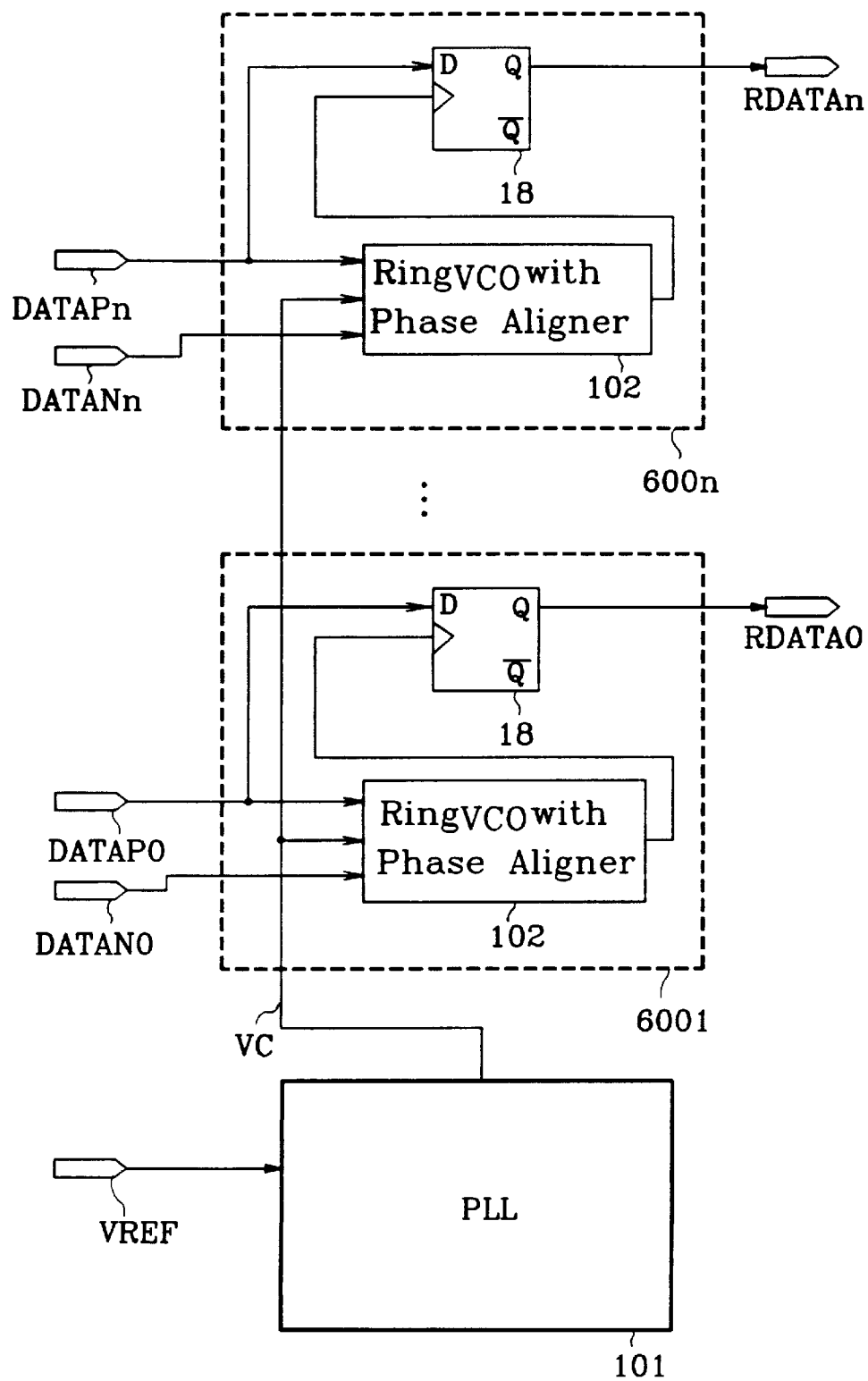
FIG. 6 is a block diagram showing the constitution of the expanded shape of the high speed NRZ data recovering apparatus according to the present invention.

As shown in FIG. 6, if a plurality of retimers 6001-600n, which consist of a phase-aligned ring voltage-controlled oscillators 102 and retiming mean 18 are connected to the PLL 101 of the present invention, then there can be obtained an NRZ data recovering apparatus in which the inputs are received through a plurality of ports.

In this case, a single PLL 101 will be enough, and VC has only to be supplied from the PLL 101. Therefore, among the plurality of the phase-aligned ring voltage-controlled oscillators and the retimers, the phase-aligned ring voltage-controlled oscillators and the retimers 6001, . . . , 600n can be distributedly installed.

That is, they can be arbitrarily disposed, and therefore, the construction of the high speed circuit becomes easy.

Further, in order to increase the jitter tolerance, a delay device can be installed between the DATAP and the D flip flop 18 in FIG. 1. However, if this is described specifically, it can be construed that it limits the scope of the present invention. Therefore, this will not be described in detail. Any modification of it should come within the scope of the present invention.

According to the present invention as described above, the present invention can be applied not only to the conventional general data recovering apparatus (i.e., the non-synchronized transmission apparatus), but also to the fields in which the NRZ data are inputted at a high speed as fast as making it impossible to use the charge-pump PLL to the bit synchronization. Therefore, the apparatus of the present invention can replace the conventional data recovering apparatus or the bit synchronization apparatus. Further, it gives the following unique effects.

First, the PLL is not directly used on the NRZ data, but the PLL is used on the clocks extracted from the NRZ data or on the externally inputted frequency-divided source clocks in recovering the NRZ data. Therefore, the apparatus of the present invention can be used for recovering high speed NRZ data.

Second, the general ring voltage-controlled oscillators which are capable of high density integration are used. Therefore, a high density integration is possible.

Third, if the phase-aligned ring voltage-controlled oscillator means and the retiming means 6001, . . . , 600n are increased in a parallel form, then multiple data recoveries and bit synchronizations are possible. Therefore, the expansion becomes easy.

Fourth, the phase-aligned ring voltage-controlled oscillator is a simple hardware, and therefore, the reliability of the data recovery is improved.

What is claimed is:

1. A bit synchronization apparatus for recovering high speed NRZ data, comprising:

a phase-locked loop (PLL) means including a first enabling/disabling voltage-controlled ring oscillator with oscillator enable/disable terminals, for generating a clock signal synchronized to an externally inputted reference signal and for outputting control voltage of said first enabling/disabling voltage-controlled ring oscillator;

a phase-aligned voltage-controlled ring oscillator means including second and third enabling/disabling voltage-controlled ring oscillators with oscillator enable/disable terminals and being connected to the PLL means, for inputting the control voltage of the first enabling/disabling voltage-controlled ring oscillator, and synthesizing and outputting output waveform of the second and third enabling/disabling voltage-controlled ring oscillators by being oscillated at logic falling or rising edges of an incoming NRZ data, voltage-frequency characteristics of said second and third enabling/disabling voltage-controlled ring oscillators being same as those of the first enabling/disabling voltage-controlled ring oscillator of the PLL means; and a retiming means connected to said phase-aligned voltage-controlled ring oscillator means, for receiving the incoming NRZ data to carry out retiming the data;

wherein said phase-aligned voltage-controlled ring oscillator means comprises:

a second enabling/disabling voltage-controlled ring oscillator connected to said loop filter means, and having a frequency of said first enabling/disabling voltage-controlled ring oscillator means, for being oscillated by being enabled at a falling transition of externally inputted NRZ data if the logic level of data are low;

a third enabling/disabling voltage-controlled ring oscillator connected to said loop filter means, and having a frequency of said first enabling/disabling voltage-controlled ring oscillator means, for being oscillated by being enabled at a rising transition of the externally inputted NRZ data if the logic level of data are high; and a synthesizing means connected to output terminals of said second enabling/disabling voltage-controlled ring oscillator and said third enabling/disabling voltage-controlled ring oscillator, for synthesizing outputs of said second and third enabling/disabling voltage-controlled ring oscillators.

2. The apparatus as claimed in claim 1, wherein said retiming means comprises:

a flip flop for receiving externally inputted NRZ data into its data input terminal and for receiving an output of said synthesizing means into its clock pulse input terminal to carry out a retiming of the data.

3. An apparatus for recovering high speed NRZ data, comprising:

a phase and frequency detecting means for comparing a phase and a frequency for a frequency-divided frequency of a voltage-controlled ring oscillator and an incoming reference frequency or externally inputted NRZ data;

a charge-pump means connected to said phase and frequency detecting means, for converting a phase difference to electric currents;

a loop filter means connected to said charge-pump means, for integrating the electric currents into voltages;

a first enabling/disabling voltage-controlled ring oscillator means connected to said loop filter means, for moving a frequency up or down by varying delays in accordance with voltages;

an N frequency-dividing means connected to said first enabling/disabling voltage-controlled ring oscillator, for N-frequency-dividing an output frequency of said enabling/disabling voltage-controlled ring oscillator to output the divided output to said phase and frequency detecting means;

a second enabling/disabling voltage-controlled ring oscillator means connected to said loop filter means, and having a same frequency as that of said first enabling/disabling voltage-controlled ring oscillator means, for being oscillated by being enabled at a falling transition of externally inputted NRZ data if data are low relative to the externally inputted NRZ data;

a third enabling/disabling voltage-controlled ring oscillator means connected to said loop filter means, and having a same frequency as that of said first enabling/disabling voltage-controlled ring oscillator means, for being oscillated by being enabled at a rising transition of the externally inputted NRZ data if data are high relative to the externally inputted NRZ data;

a synthesizing means connected to output terminals of said second enabling/disabling voltage-controlled ring oscillator means and said third enabling/disabling voltage-controlled ring oscillator means, for synthesizing outputs of said second and third enabling/disabling voltage-controlled ring oscillator means; and a retiming means consisting of a flip flop, for receiving externally inputted NRZ data into its data input terminal, and for receiving output of said synthesizing means into its clock pulse input terminal to carry out a retiming of data.

* * * * *